(12) United States Patent
Yamamoto et al.

(10) Patent No.: US 9,633,980 B2
(45) Date of Patent: Apr. 25, 2017

(54) SEMICONDUCTOR DEVICE

(71) Applicant: Kabushiki Kaisha Toshiba, Minato-ku (JP)

(72) Inventors: Hiroaki Yamamoto, Yokohama (JP); Koji Kuroki, Hachioji (JP); Masaru Koyanagi, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/069,143

(22) Filed: Mar. 14, 2016

(65) Prior Publication Data

US 2016/0351542 A1 Dec. 1, 2016

Related U.S. Application Data

(60) Provisional application No. 62/168,108, filed on May 29, 2015.

(51) Int. Cl.
*H01L 29/40* (2006.01)
*H01L 25/065* (2006.01)

(52) U.S. Cl.
CPC .... *H01L 25/0657* (2013.01); *H01L 2225/06513* (2013.01); *H01L 2225/06541* (2013.01); *H01L 2225/06582* (2013.01)

(58) Field of Classification Search
CPC ............ C09K 11/06; C09K 11/025; C09K 2211/1007; C09K 2211/185; H01L 51/0085
USPC ........................................................ 257/621
See application file for complete search history.

(56) References Cited

U.S. PATENT DOCUMENTS

| | | | |
|---|---|---|---|
| 2009/0032973 | A1 | 2/2009 | Sasaki et al. |
| 2012/0112361 | A1* | 5/2012 | Han .......... H01L 23/481 257/774 |
| 2015/0255411 | A1* | 9/2015 | Karhade .......... G06F 1/1686 361/679.55 |
| 2016/0203253 | A1* | 7/2016 | Fang .......... G06F 17/5072 716/112 |

FOREIGN PATENT DOCUMENTS

| | | |
|---|---|---|
| JP | 2002-76251 | 3/2002 |
| JP | 2009-38142 | 2/2009 |
| JP | 2011-61132 | 3/2011 |

* cited by examiner

*Primary Examiner* — Andy Huynh
(74) *Attorney, Agent, or Firm* — Oblon, McClelland, Maier & Neustadt, L.L.P.

(57) ABSTRACT

According to one embodiment, a semiconductor device includes a first semiconductor chip including a first circuit, a second circuit, a first interconnect connected to the first circuit, a second interconnect connected to the second circuit, and a third interconnect connecting the first interconnect and the second interconnect.

13 Claims, 5 Drawing Sheets

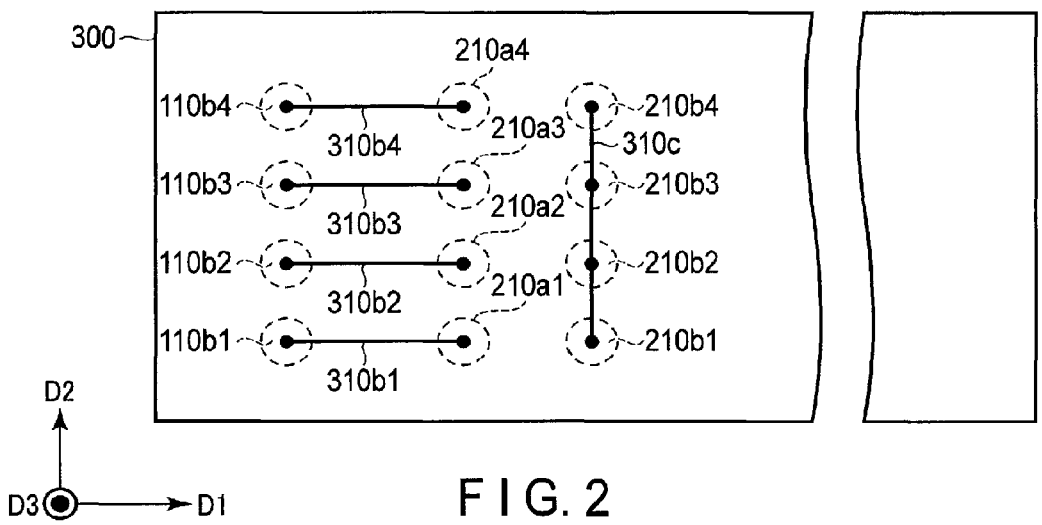
F I G. 2
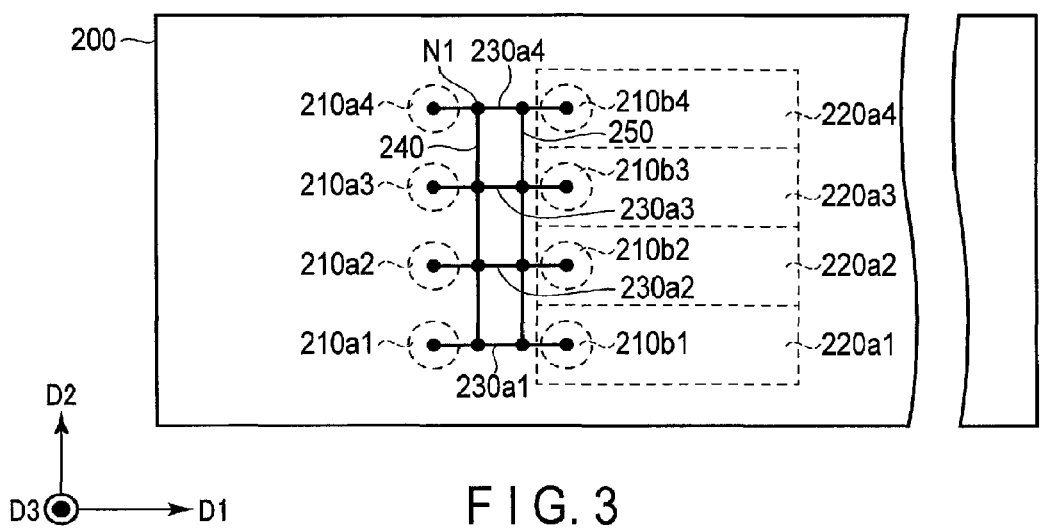
F I G. 3

SEMICONDUCTOR DEVICE

CROSS REFERENCE TO RELATED APPLICATIONS

This application claims the benefit of U.S. Provisional Application No. 62/168,108, filed May 29, 2015, the entire contents of which are incorporated herein by reference.

FIELD

Embodiments described herein relate generally to a semiconductor device.

BACKGROUND

In order to increase a memory capacity in a semiconductor device, a multi-chip package has been proposed. In the multi-chip package, a plurality of core chips (semiconductor chips) are stacked on a package substrate and packaged. As a method in which plural core chips are stacked, a TSV (Through Silicon Via) method has been proposed.

BRIEF DESCRIPTION OF THE DRAWINGS

FIG. 2 is a plan view illustrating a interconnect layer of the semiconductor device according to the embodiment.

FIG. 3 is a plan view illustrating an interface chip of the semiconductor device according to the embodiment.

DETAILED DESCRIPTION

In general, according to one embodiment, a semiconductor device includes a first semiconductor chip including a first circuit, a second circuit, a first interconnect connected to the first circuit, a second interconnect connected to the second circuit, and a third interconnect connecting the first interconnect and the second interconnect; a interconnect section provided on the first semiconductor chip and including a first external connection terminal and a second external connection terminal, a first terminal and a second terminal which are connected to the first interconnect, a third terminal and a fourth terminal which are connected to the second interconnect, a fourth interconnect connecting the first external connection terminal and the first terminal, a fifth interconnect connecting the second external connection terminal and the third terminal, and a sixth interconnect connecting the second terminal and the fourth terminal; and a second semiconductor chip provided on the interconnect section and including a via, the second semiconductor chip being electrically connected to the first semiconductor chip via the via.

Embodiments will be described hereinafter with reference to the accompanying drawings. In the description below, structural elements having substantially the same functions and structures are denoted by like reference signs. In addition, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

It should be noted that the drawings are schematic ones, and the relationship between a thickness and a planar dimension, the ratio in thickness between layers, etc. are different from real ones. Thus, concrete thicknesses and dimensions should be judged in consideration of descriptions below. Needless to say, the drawings include parts with mutually different relations or ratios of dimensions.

<1> Embodiment

<1-1> Configuration of Semiconductor Device

Figure 1:
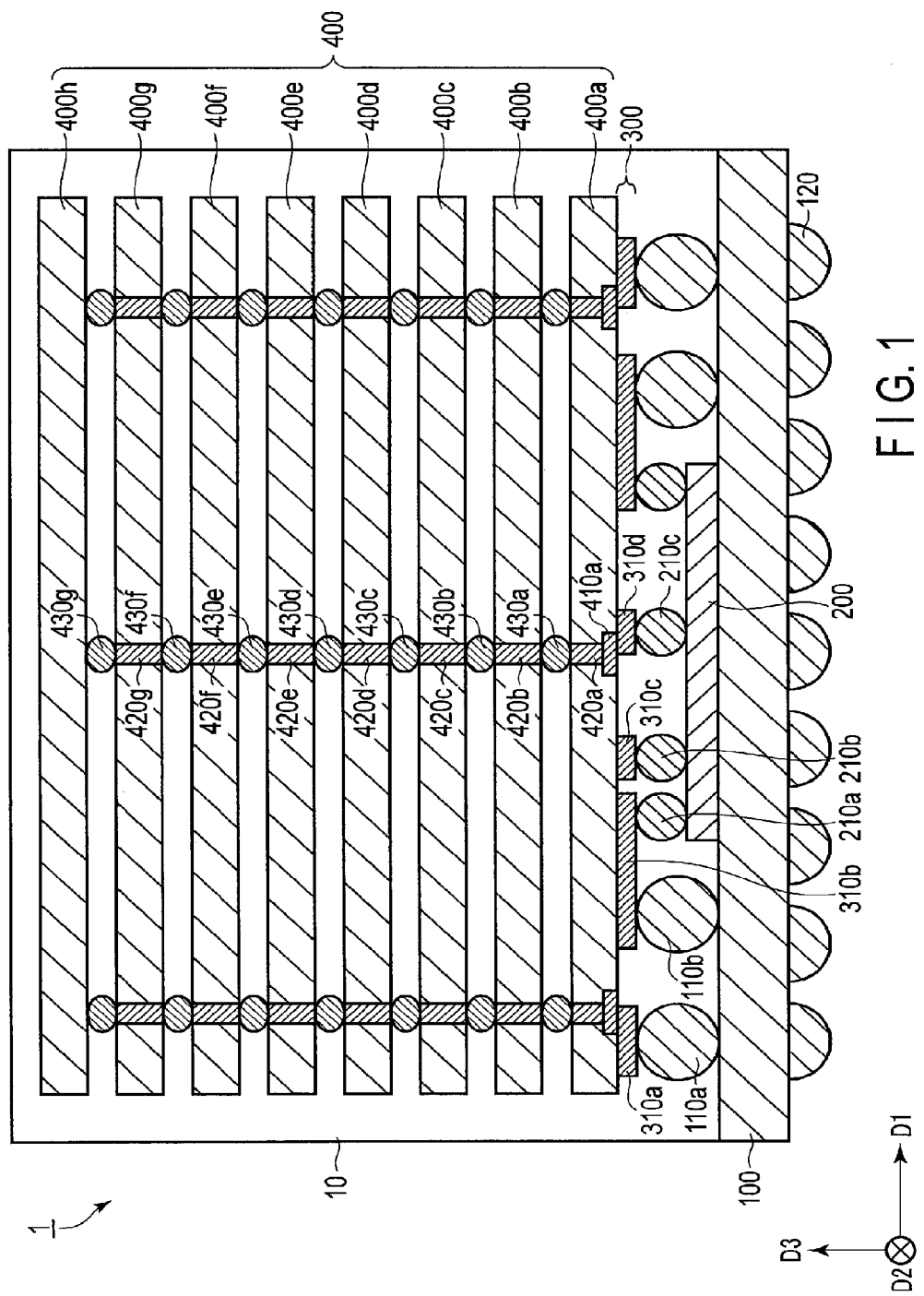
FIG. 1 is a cross-sectional view illustrating a semiconductor device according to an embodiment.

Referring to FIG. 1, the configuration of a semiconductor device according to an embodiment is described.

As illustrated in FIG. 1, a semiconductor device 1 according to the embodiment includes a package substrate 100, an interface chip 200, a interconnect layer 300, and a multilayer chip 400.

Bumps 120 are provided on a lower surface (a plane defined by a direction D1 and a direction D2 which is perpendicular to the direction D1) of the package substrate (semiconductor substrate) 100. For example, the bumps 120 are solder balls. The interface chip (semiconductor chip) 200 is provided on an upper surface of the package substrate 100. The interconnect layer 300 is provided above an upper surface of the interface chip 200 and the upper surface of the package substrate 100. The multilayer chip 400 is provided on an upper surface of the interconnect layer 300. The upper surface of the package substrate 100, the interface chip 200, the interconnect layer 300 and the multilayer chip 400 are packaged by resin 10.

The package substrate 100 is electrically connected to the outside via interconnects (not shown), contacts (not shown) and the bumps 120. A power supply voltage VCC and a ground voltage VSS, or signals (data signals, command signals, etc.) IO, are supplied from the outside to the package substrate 100 via the bumps 120.

The package substrate 100 supplies the power supply voltage VCC and ground voltage VSS to the multilayer chip 400 via the interconnect layer 300. In addition, the package substrate 100 supplies the power supply voltage VCC and ground voltage VSS, or the signals IO from the outside, to the interface chip 200 via the interconnect layer 300.

The multilayer chip 400 includes a plurality of chips 400$a$ to 400$h$. The plural chips 400$a$ to 400$h$ are stacked in order from the lower side in a direction D3 (a direction perpendicular to the direction D1 and direction D2). For example, a TSV (through-silicon via, also referred to as "contact" or "via") 420$a$, which extends from an upper surface to a lower surface of the chip 400$a$, is provided in the chip 400$a$. Similarly, TSVs 420$b$ to 420$g$, which extend from upper surfaces to lower surfaces of the chips 400$b$ to 400$g$, are provided in the chips 400$b$ to 400$g$, respectively. In addition, a bump 430$a$ is provided between the TSV 420$a$ and TSV 420$b$. Similarly, bumps 430$b$ to 430$f$ are provided between the TSVs 420$b$ to 420$g$. Further, the chip 400$h$ is connected to the TSV 420$g$ via a bump 430$g$. In this manner, the TSVs 420$a$ to 420$g$ are electrically connected. Incidentally, in FIG. 1, although the TSVs 420$a$ to 420$g$ are arranged on one straight line, the arrangement is not limited to this. For example, the TSVs 420a to 420g may be arranged on different straight lines.

The interconnect layer 300 is provided on a lower surface of the chip 400a of the lowermost layer. The interconnect layer 300 includes a plurality of interconnects, and an insulation layer (not shown). Bumps 210a, 210b and 210c are provided between this interconnect layer 300 and the interface chip 200. On the other hand, bumps 110a and 110b are provided between the interconnect layer 300 and the package substrate 100. The distance between the interconnect layer 300 and interface chip 200 is less than the distance between the interconnect layer 300 and package substrate 100. Accordingly, the size (e.g. planar size) of each of the bumps 210a, 210b and 210c is smaller than the size of each of the bump 110a and bump 110b.

The multilayer chip 400 includes, for example, a memory circuit such as a NAND flash memory or a DRAM, and a memory controller. The multilayer chip 400 stores data, etc. from the outside.

The interface chip 200 includes an interface circuit. The interface circuit is composed of a logic circuit, an analog circuit, etc. The interface chip 200 transfers a signal ID, a power supply voltage and a ground voltage between the package substrate 100 and multilayer chip 400.

<1-2> Configurations of Interconnect Layer and Interface

Next, referring to FIG. 2 and FIG. 3, the interconnect layer 300 and interface chip 200 of the semiconductor device according to the embodiment will be described.

As illustrated in FIG. 2, the interconnect layer 300 includes a interconnect 310b and a interconnect 310c. The interconnect 310b includes, for example, four interconnects 310b1 to 310b4. In addition, in association with the interconnects 310b1 to 310b4, the bump 110b includes bumps 110b1 to 110b4, and the bump 210a includes bumps 210a1 to 210a4.

The interconnect 310b1 is electrically connected to the bump 110b1 and bump 210a1. Similarly, the interconnect 310b2 is electrically connected to the bump 110b2 and bump 210a2. The interconnect 310b3 is electrically connected to the bump 110b3 and bump 210a3. The interconnect 310b4 is electrically connected to the bump 110b4 and bump 210a4. Next, referring to FIG. 3, the interface chip 200 of the semiconductor device according to the embodiment is described.

As illustrated in FIG. 3, the interface chip 200 includes interconnects 230a1 to 230a4, a interconnect 240, a interconnect 250, and internal circuits 220a1 to 220a4. The bump 210b includes bumps 210b1 to 210b4 in association with the interconnects 230a1 to 230a4. The interconnect 230a1 is electrically connected to the bump 210a1 and bump 210b1. The interconnect 230a2 is electrically connected to the bump 210a2 and bump 210b2. The interconnect 230a3 is electrically connected to the bump 210a3 and bump 210b3. The interconnect 230a4 is electrically connected to the bump 210a4 and bump 210b4. In addition, the interconnects 230a1 to 230a4 are electrically connected at nodes N1 by the interconnect 240 and interconnect 250 which extend in the direction D2. The internal circuits 220a1 to 220a4 are connected to the interconnects 230a1 to 230a4, respectively.

In addition, as illustrated in FIG. 2, the interconnect layer 310c electrically connects the bumps 210b1 to 210b4.

Thereby, the interconnects 230a1 to 230a4 are electrically connected by the interconnect 240, interconnect 250 and interconnect 310c. Specifically, the interconnects 230a1 to 230a4 are short-circuited not only by the interconnects of the interface chip 200, but also by the interconnects of the interconnect layer 300.

In the meantime, what is input to the internal circuits 220a1 to 220a4 via the bumps 110b1 to 110b4 may be the power supply voltage VCC, ground voltage VSS, or the signal IO from the outside.

<1-3> Advantageous Effects

According to the above-described embodiment, the plural interconnects, which are provided on the interconnect layer 300, and the plural interconnects, which are provided on the interface chip 200, are electrically connected.

In recent years, with the advancement in speed of data transfer, the current consumption has been increasing, and there is a possibility of occurrence of EM or IR-Drop. In particular, as a result of the occurrence of IR-Drop, it is possible that the on/off ratio (duty ratio) of a clock signal collapses, or an error (skew) occurs in the timing of a clock signal. As a result, there is a possibility that the performance of the semiconductor device deteriorates. As a measure to cope with this, it is thinkable to increase the line width of power supply interconnect in the semiconductor device. However, owing to this measure, it is possible that the chip size of the semiconductor device will increase and the cost will rise.

As described above, in the semiconductor device according to the present embodiment, the interconnects 230a1 to 230a4 are short-circuited (connected) by the interconnect 240, interconnect 250 and interconnect 310. Thereby, in the semiconductor device, the same advantageous effect as in the case of increasing the line width of the power supply interconnect can be obtained. As a result, in a chip internal circuit of a memory chip or the like, the robustness of the power supply interconnect or signal interconnect can be increased. Therefore, a high-quality semiconductor device can be provided.

<2> Modification 1

Figure 4:
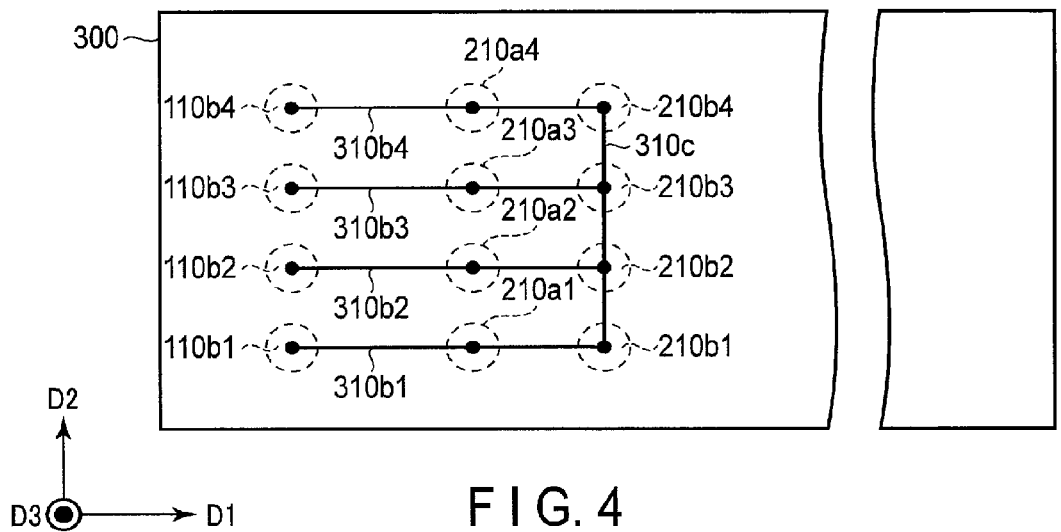
FIG. 4 is a plan view illustrating a interconnect layer of a semiconductor device according to Modification 1 of the embodiment.

Next, referring to FIG. 4, Modification 1 of the interconnect layer 300 of the semiconductor device according to the embodiment is described.

As illustrated in FIG. 4, the interconnect 310b1 is electrically connected to the bump 110b1, bump 210a1 and bump 210b1. In addition, the interconnect 310b2 is electrically connected to the bump 110b2, bump 210a2 and bump 210b2. The interconnect 310b3 is electrically connected to the bump 110b3, bump 210a3 and bump 210b3. The interconnect 310b4 is electrically connected to the bump 110b4, bump 210a4 and bump 210b4.

Furthermore, the interconnect 310c, which extends in the direction D2, electrically connects the bumps 210b1 to 210b4.

Thereby, the interconnects 230a1 to 230a4 according to Modification 1 are short-circuited by a greater number of interconnects than the interconnects 230a1 to 230a4 according to the above-described embodiment. As a result, the robustness of the power supply interconnect and signal interconnect can further be increased.

<3> Modification 2

Figure 5:
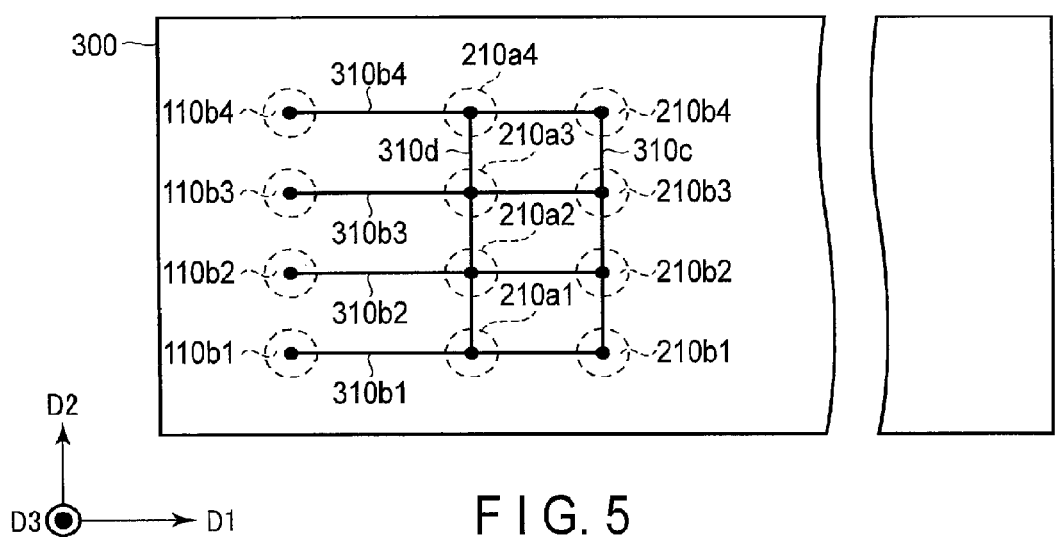
FIG. 5 is a plan view illustrating a interconnect layer of a semiconductor device according to Modification 2 of the embodiment.

Next, referring to FIG. 5, Modification 2 of the interconnect layer 300 of the semiconductor device according to the embodiment is described.

As illustrated in FIG. 5, the interconnect 310b1 is electrically connected to the bump 110b1, bump 210a1 and bump 210b1. In addition, the interconnect 310b2 is electrically connected to the bump 110b2, bump 210a2 and bump 210b2. The interconnect 310b3 is electrically connected to the bump 110b3, bump 210a3 and bump 210b3. The interconnect 310*b*4 is electrically connected to the bump 110*b*4, bump 210*a*4 and bump 210*b*4.

The interconnect layer 300 includes a interconnect 310*d* which extends in the direction D2. In addition, the bumps 210*a*1 to 210*a*4 are electrically connected by the interconnect 310*d*.

Besides, the interconnect 310*c*, which extends in the direction D2, electrically connects the bumps 210*b*1 to 210*b*4.

Thereby, the interconnects 230*a*1 to 230*a*4 according to Modification 2 are short-circuited by a greater number of interconnects than the interconnects 230*a*1 to 230*a*4 according to the above-described Modification 2. As a result, the robustness of the power supply interconnect and signal interconnect can further be increased.

<4> Modification 3

Figure 6:
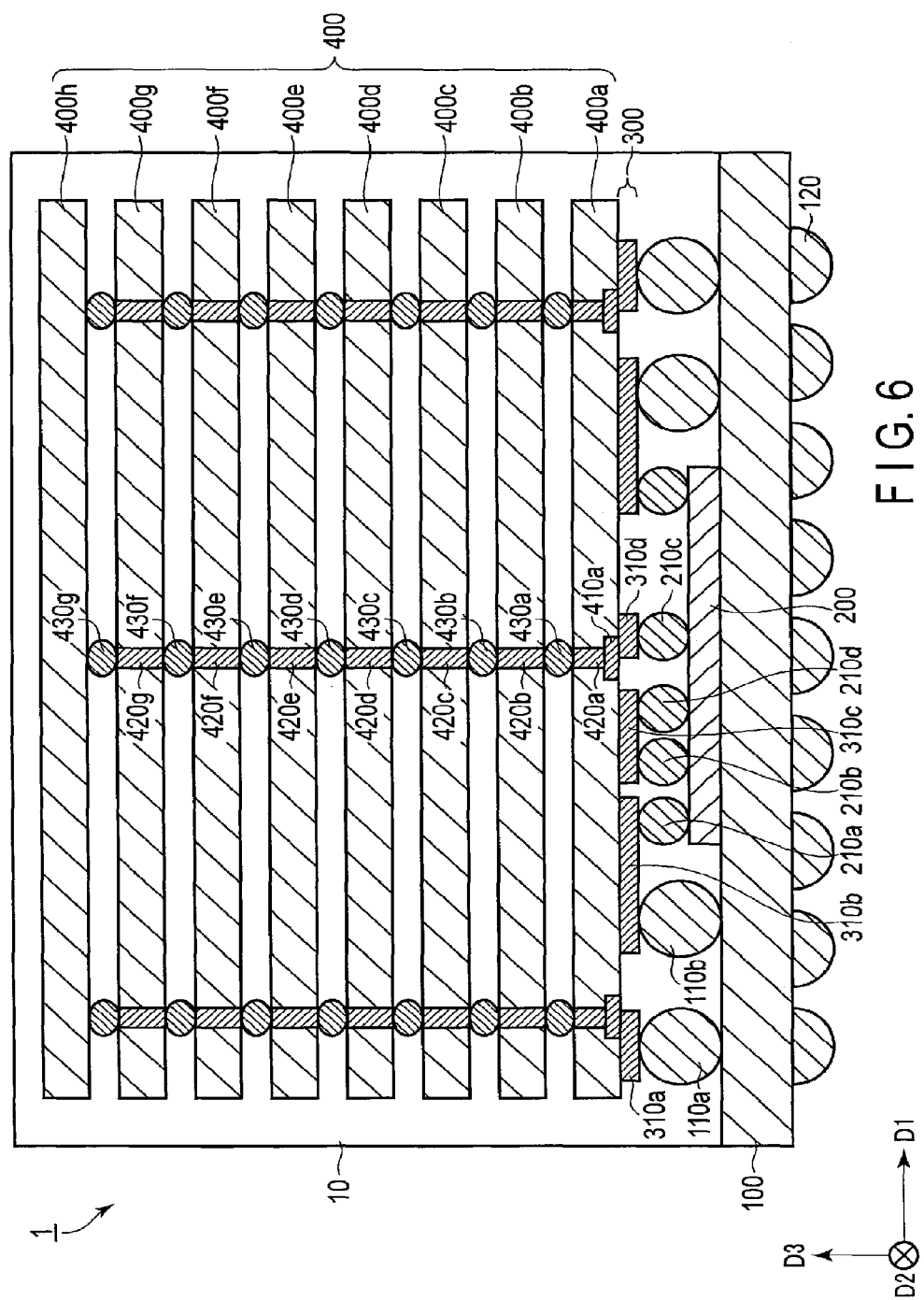
FIG. 6 is a cross-sectional view illustrating a semiconductor device according to Modification 3 of the embodiment.

Next, referring to FIG. 6, Modification 3 of the semiconductor device according to the embodiment is described.

As illustrated in FIG. 6, the interconnect 310*c* of the interconnect layer 300 may further be extended and a bump 210*d* may be added. Thereby, the robustness of the power supply interconnect and signal interconnect can further be increased.

<5> Modification 4

Figure 7:
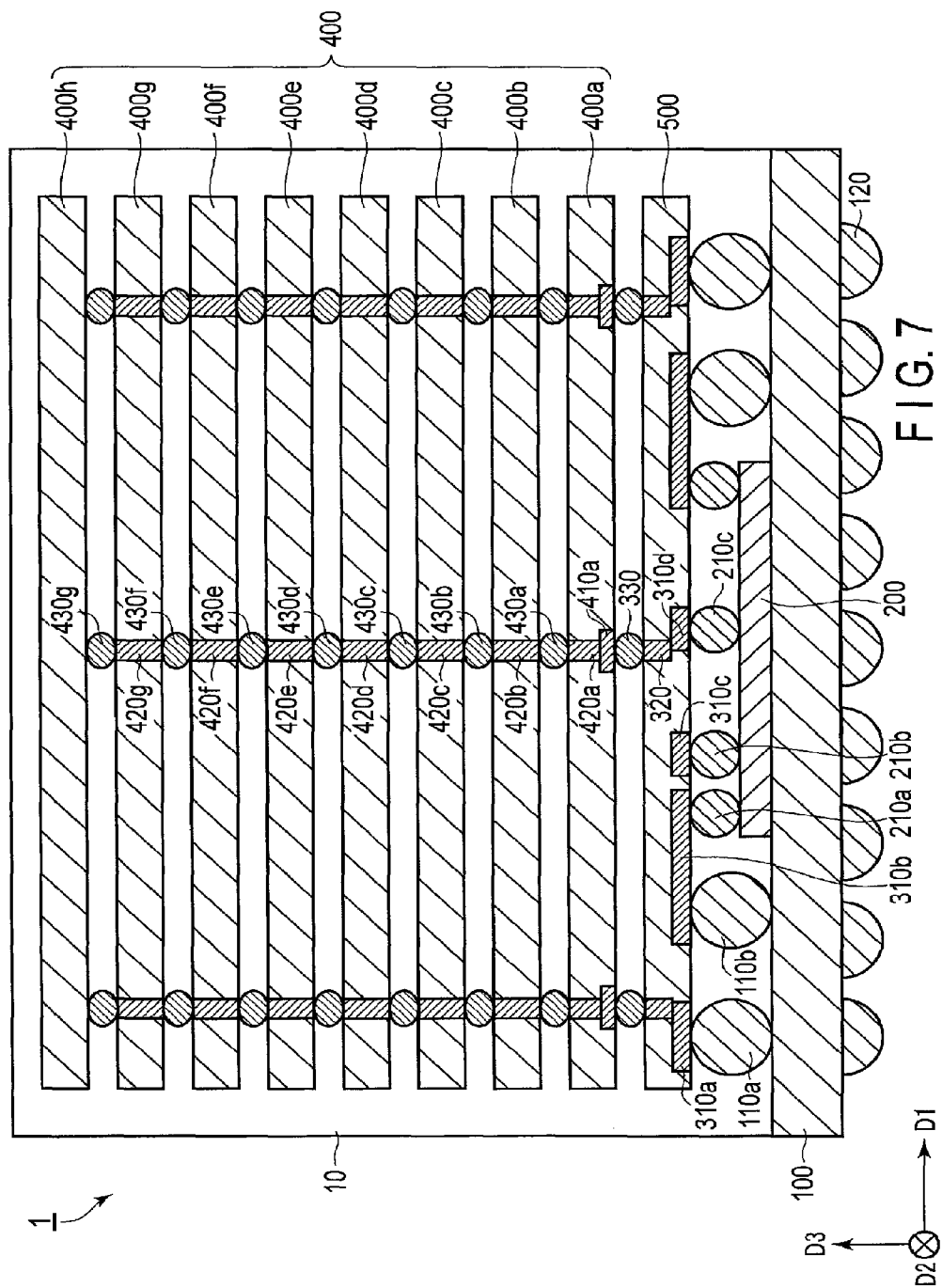
FIG. 7 is a cross-sectional view illustrating a semiconductor device according to Modification 4 of the embodiment.

Next, referring to FIG. 7, Modification 4 of the semiconductor device according to the embodiment is described.

As illustrated in FIG. 7, the interconnect layer 300 in the above-described embodiment may be configured as a interconnect layer chip (semiconductor) 500.

As illustrated in FIG. 7, the interconnect layer chip 500 includes, on a lower surface thereof, the interconnects described in the first embodiment. In addition, a TSV (through-silicon via) 320, which extends from an upper surface to a lower surface of the interconnect layer chip 500, is provided in the interconnect layer chip 500. In addition, the interconnect 310*d* is electrically connected to the interconnect 410*a* via the TSV 320 and a bump 330. In this manner, the TSV 320 and the TSVs 420*a* to 420*g* are electrically connected.

In the meantime, it should suffice if the above-described interconnects and bumps are formed of a metallic material. In addition, in the above-described embodiment, although the multilayer chip 400 includes the plural chips 400*a* to 400*h*, the embodiment is not limited to this. Furthermore, in FIG. 2 and FIG. 3, although the four bumps 110*b*1 to 110*b*4 are depicted as being electrically connected to the four internal circuits 220*a*1 to 220*a*4, the embodiment is not limited to this. For example, it should suffice if such a configuration is adopted that a plurality of bumps 110*b* are electrically connected to a plurality of internal circuits 220*a*. Moreover, in the above-described embodiment, although the case was described in which the number of internal circuits 220*a* is four, the embodiment is not limited to this. Besides, although the four internal circuits 220*a* are described as being different, the embodiment is not necessarily limited to this, and the four internal circuits 220*a* may be identical internal circuits 220*a*.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor chip including a first circuit, a second circuit, a first interconnect connected to the first circuit, a second interconnect connected to the second circuit, and a third interconnect connecting the first interconnect and the second interconnect;
an interconnect section provided on the first semiconductor chip and including a first bump and a second bump, a third bump and a fourth bump which are connected to the first interconnect, a fifth bump and a sixth bump which are connected to the second interconnect, a fourth interconnect connecting the first bump and the third bump, a fifth interconnect connecting the second bump and the fifth bump, and a sixth interconnect connecting the fourth bump and the sixth bump; and
a second semiconductor chip provided on the interconnect section and including a via, the second semiconductor chip being electrically connected to the first semiconductor chip via the via.

2. The device according to claim 1, wherein the second semiconductor chip is a memory chip.

3. The device according to claim 1, wherein the interconnect section further includes a seventh interconnect connecting the third bump and the fourth bump.

4. The device according to claim 1, wherein the interconnect section further includes an eighth interconnect connecting the third bump and the fifth bump.

5. The device according to claim 1, wherein the first to sixth interconnects are power supply interconnects.

6. The device according to claim 1, wherein the interconnect section is provided in a third semiconductor chip.

7. The device according to claim 6, further comprising a package substrate,
wherein the first semiconductor chip is provided on the package substrate, and the first to third semiconductor chips are sealed with resin.

8. A semiconductor device comprising:
a first semiconductor chip including a first circuit, and a first interconnect connected to the first circuit; and
a second semiconductor chip provided above the first semiconductor chip and including a via,
wherein the second semiconductor chip includes a second interconnect,
the second interconnect is provided on a first surface of the second semiconductor chip,
the first surface being opposed to the first semiconductor chip, the second semiconductor chip includes a first bump provided on the first surface, and the first bump is connected to the first interconnect of the first semiconductor chip.

9. The device according to claim 8, wherein the first semiconductor chip further includes:
a second circuit;
a third interconnect connected to the second circuit; and
a fourth interconnect connecting the first interconnect and the third interconnect.

10. The device according to claim 9, further comprising:
a second bump connecting the third interconnect of the first semiconductor chip and the second interconnect of the second semiconductor chip,
wherein the first bump connects the first interconnect of the first semiconductor chip and the second interconnect of the second semiconductor chip.

11. The device according to claim 9, further comprising:
a package substrate;
a second bump provided on the package substrate; and
a sealing resin provided on the package substrate and covering the first semiconductor chip and the second semiconductor chip,
wherein the first semiconductor chip is provided on that surface of the package substrate, which is opposed to a surface thereof on which the second bump is provided, and
the second bump is electrically connected to the first bump.

12. The device according to claim 8, wherein the second semiconductor chip is a memory chip.

13. The device according to claim 8, wherein the first and second interconnects are power supply interconnects.

\* \* \* \* \*